United States Patent
Jeong

(10) Patent No.: US 8,269,250 B2
(45) Date of Patent: Sep. 18, 2012

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

(*) Notice: Subject to any disclaimer, the term of this patent is extended or adjusted under 35 U.S.C. 154(b) by 131 days.

(21) Appl. No.: 12/705,130

(22) Filed: Feb. 12, 2010

(65) Prior Publication Data

US 2010/0207159 A1    Aug. 19, 2010

(30) Foreign Application Priority Data

Feb. 16, 2009    (KR) .................. 10-2009-0012481

(51) Int. Cl.
*H01L 33/36* (2010.01)
*H01L 33/44* (2010.01)

(52) U.S. Cl. ............... 257/99; 257/100; 257/E33.059; 257/E33.062

(58) Field of Classification Search ............ 257/81, 257/99, 100, E33.059, E33.06, E33.064, 257/E33.062
See application file for complete search history.

(56) References Cited

U.S. PATENT DOCUMENTS

| | | |
|---|---|---|
| 5,925,896 A | 7/1999 | Dutta |
| 8,143,640 B2 | 3/2012 | Lee |
| 2002/0190260 A1 | 12/2002 | Shen et al. |
| 2004/0104390 A1 | 6/2004 | Sano et al. |
| 2008/0006836 A1* | 1/2008 | Lee .................................. 257/98 |
| 2010/0224890 A1* | 9/2010 | Keller et al. .................... 257/93 |

FOREIGN PATENT DOCUMENTS

| | | |
|---|---|---|
| CN | 101084583 A | 12/2007 |
| JP | 07-176830 A | 7/1995 |
| JP | 2006-332504 A | 12/2006 |
| KR | 10-2006-0032167 A | 4/2006 |
| KR | 10-2006-0057855 A | 5/2006 |

OTHER PUBLICATIONS

Kim et al., "Leakage Current Characteristics of Vertical GaN-Based Light Emitting Diodes with Passivation Structures," Electrochemical and Solid-State Letters, vol. 10, No. 11, pp. H334-H337, The Electrochemical Society (2007).

* cited by examiner

*Primary Examiner* — Jerome Jackson, Jr.
*Assistant Examiner* — Yu Chen
(74) *Attorney, Agent, or Firm* — Birch, Stewart, Kolasch & Birch, LLP

(57) ABSTRACT

Disclosed is a semiconductor light emitting device. The semiconductor light emitting device includes a light emitting structure including a plurality of compound semiconductor layers, a second electrode layer below the light emitting structure, a channel layer between the light emitting structure and an edge area of the second electrode layer, a buffer layer on the channel layer, and a passivation layer on the buffer layer.

6 Claims, 11 Drawing Sheets

US 8,269,250 B2

SEMICONDUCTOR LIGHT EMITTING DEVICE

CROSS-REFERENCE TO RELATED APPLICATIONS

The present application claims the benefit under 35 U.S.C. §119 of Korean Patent Application No. 10-2009-0012481, filed Feb. 16, 2009, which is hereby incorporated by reference in its entirety.

BACKGROUND

The embodiment relates to a semiconductor light emitting device and a method of manufacturing the same.

Group III-V nitride semiconductors are spotlighted as core materials of light emitting diodes (LEDs) or laser diodes (LDs) due to physical and chemical characteristics. The group III-V nitride semiconductors mainly include semiconductor materials having a composition formula of $In_xAl_yGa_{1-x-y}N$ ($0 \leq x \leq 1$, $0 \leq y \leq 1$, $0 \leq x+y \leq 1$).

The LED is a kind of a semiconductor device, which transmits/receives signals by converting electricity into light using the characteristic of the compound semiconductor and is used as a light source.

The LED and LD employing such nitride semiconductors have been mainly used in light emitting devices to obtain light, and have been applied to various appliances (e.g., a light emitting part of a key pad of a portable phone, an electric bulletin board, an illumination device) as a light source.

SUMMARY

The embodiment provides a semiconductor light emitting device and a method of manufacturing the same, capable of reducing stress caused by heat transfer between a light emitting structure and another medium.

The embodiment provides a semiconductor light emitting device and a method of manufacturing the same, capable of reducing thermal deformation of a passivation layer provided at an outer peripheral portion of the light emitting structure.

According to the embodiment, the semiconductor light emitting device includes a light emitting structure including a plurality of compound semiconductor layers, a second electrode layer below the light emitting structure, a channel layer between the light emitting structure and an edge area of the second electrode layer, a buffer layer on the channel layer, and a passivation layer on the buffer layer.

According to the embodiment, the semiconductor light emitting device includes a light emitting structure including a first conductive semiconductor layer, an active layer below the first conductive semiconductor layer, and a second conductive semiconductor layer below the active layer, a first electrode layer on the light emitting structure, a second electrode layer below the light emitting structure, a channel layer between the light emitting structure and an edge area of the second electrode layer, a buffer layer on the channel layer, and a passivation layer on the buffer layer.

According to the embodiment, the method of manufacturing the semiconductor light emitting device is as follows. A light emitting structure is formed by using a plurality of compound semiconductor layers. A channel layer is formed along an outer peripheral portion of a top surface of the light emitting structure. A second electrode layer is formed on the light emitting structure. The channel layer is exposed by removing the outer peripheral portion of the light emitting structure through a mesa etching. A buffer layer is formed on the channel layer. A passivation layer is formed on the buffer layer.

According to the embodiment, stress caused by heat transfer can be reduced by using the buffer layer having low thermal deformation.

According to the embodiment, the buffer layer is inserted into the passivation layer provided at the outer peripheral portion of the light emitting structure, thereby minimizing the breaking or the bending of a wafer in laser scribing or breaking.

According to the embodiment, the buffer layer having low thermal deformation is provided at the outer peripheral portion of the light emitting structure such that the buffer layer is spaced apart from the light emitting structure, thereby reducing the stress of a chip to improve reliability of the chip.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

In the description about the embodiment, the thickness or the size of elements shown in the accompanying drawings are for an illustrative purpose only, but the embodiment is not limited thereto.

Hereinafter, embodiments will be described with reference to accompanying drawings.

Figure 1:
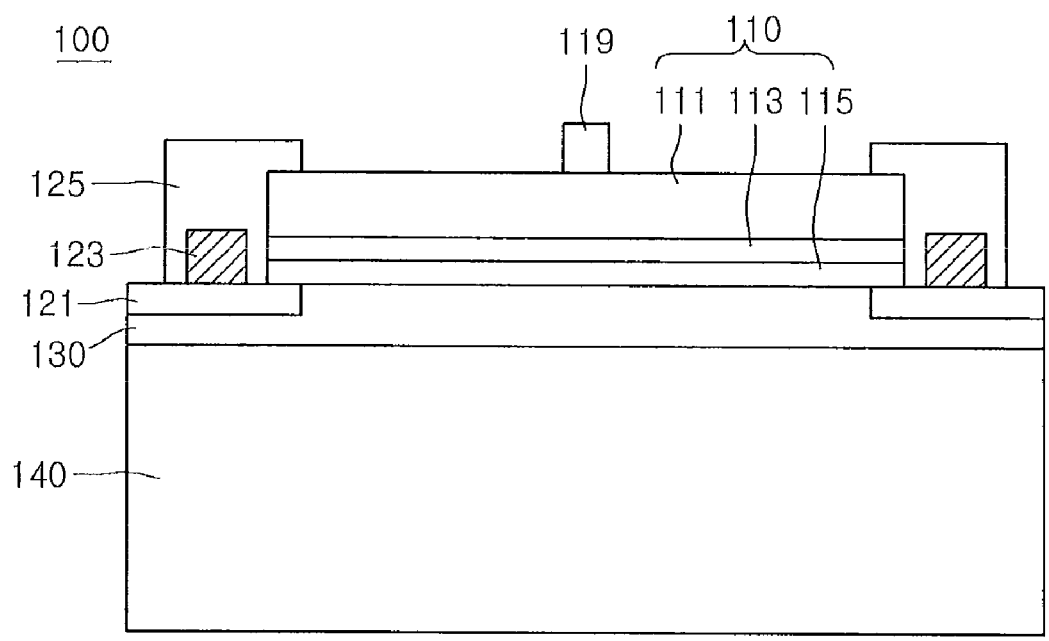
FIG. 1 is a sectional view showing a semiconductor light emitting device according to a first embodiment.

FIG. 1 is a sectional view showing a semiconductor light emitting device according to a first embodiment.

Referring to FIG. 1, a semiconductor light emitting device 100 according to the embodiment includes a light emitting structure 110, a first electrode layer 119, a channel layer 121, a buffer layer 123, a passivation layer 125, a second electrode layer 130, and a conductive support member 140.

The light emitting structure 110 includes a first conductive semiconductor layer 111, an active layer 113, and a second conductive semiconductor layer 115. The active layer 113 is interposed between the first and second conductive semiconductor layers 111 and 115.

The first conductive semiconductor layer 111 may be realized by using at least one semiconductor layer doped with a first conductive dopant. The first conductive semiconductor layer 111 may be realized by using a group III-V compound semiconductor. For example, the first conductive semiconductor layer 111 includes at least one selected from among GaN, InN, AlN, InGaN, AlGaN, InAlGaN, and AlInN. When the first conductive semiconductor layer 111 is an N-type semiconductor layer, the first conductive dopant may be an N-type dopant. For example, the N-type dopant may include Si, Ge, Sn, Se, or Te.

The first conductive semiconductor layer 111 may be provided on a top surface thereof with the first electrode layer 119 having a predetermined pattern. In addition, concave-convex shaped roughness may be formed on a portion of the top surface of the first conductive semiconductor layer 111 or the entire portion of the top surface of the first conductive semiconductor layer 111.

The active layer 113 is provided below the first conductive semiconductor layer 111. The active layer 113 may have a single quantum well (SQW) structure or a multiple quantum well (MQW) structure. The active layer 113 may be formed at a cycle of a well layer and a barrier layer by using group III-V compound semiconductor materials. For example, the active layer 113 may be formed at a cycle of an InGaN well layer/GaN barrier layer or an AlGaN well layer/GaN barrier layer.

The active layer 113 includes a band-gap energy corresponding to the wavelength of light to be emitted. For example, if the active layer 113 emits blue light having a wavelength in the range of 460 nm to 470 nm, the active layer 113 may be formed in the SQW structure or the MQW structure at a cycle of the InGaN well layer/GaN barrier layer. For example, the active layer 113 may include a material of emitting light in a visible ray region having blue, red, and green wavelengths.

A conductive clad layer may be provided above and/or below the active layer 113. For example, the conductive clad layer may include an AlGaN layer.

The second conductive semiconductor layer 115 may be provided below the active layer 113. The second conductive semiconductor layer 115 may be realized by using at least one semiconductor layer doped with a second conductive dopant. For example, the second conductive semiconductor layer 115 may be realized by using a group III-V compound semiconductor. For example, the second conductive semiconductor layer 115 may include at least one selected from among GaN, InN, AlN, InGaN, AlGaN, InAlGaN, and AlInN. If the second conductive semiconductor layer 115 is a P-type semiconductor layer, the second conductive dopant may be a P-type dopant. For example, the P-type dopant may include Mg, Zn, Ca, Sr, or Ba.

A third conductive semiconductor layer (not shown) may be provided on the second conductive semiconductor layer 115. If the first conductive semiconductor layer 111 is a P-type semiconductor layer, the second conductive semiconductor layer 115 may be realized as an N-type semiconductor layer. The third conductive semiconductor layer may be realized as a semiconductor layer doped with a first type dopant. The light emitting structure 110 may include one of an N-P junction structure, a P-N junction structure, an N-P-N junction structure, and a P-N-P junction structure.

The channel layer 121 and the second electrode layer 130 may be provided below the second conductive semiconductor layer 115.

An inner portion of the channel layer 121 may be provided along an outer peripheral portion of the second conductive semiconductor layer 115 below the second conductive semiconductor layer 115. In addition, an outer portion of the channel layer 121 may extend outward the conductive semiconductor layer 115.

The channel layer 121 may be formed on a boundary region of the top of the second electrode layer 130. That is, the channel layer 121 may be formed on the boundary region between the light emitting structure 110 and the second electrode layer 130. The channel layer 121 may be formed of a conductive channel layer using a conductive material or a non-conductive channel layer using a non-conductive material.

The conductive channel layer may be formed of a transparent conductive oxide layer or may include at least one of Ti, Ni, Pt, Pd, Rh, Ir, and W. For example, the transparent conductive oxide layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

In addition, if isolation etching is performed on the light emitting structure 110 to separate the light emitting structure 110 by a unit chip without the channel layer 121 during a chip separation process, fragments are generated from the second electrode layer 130. The fragments are attached between the second conductive semiconductor layer 115 and the active layer 113 or between the active layer 113 and the first conductive semiconductor layer 111, such that electrical short may occur. Accordingly, the conductive protective layer is formed of a material that is not cracked or does not generate fragments during isolation etching. Therefore, the fragments of the second electrode layer 130 are not generated and the electrical short is not occurred.

In other words, the channel layer 121 may be formed of a conductive material or an insulating material with transparent. The channel layer 121 may be provided between the outer portion of the second conductive semiconductor layer 115 and an edge area of the second electrode layer 130.

The channel layer 121 may include an insulating material such as ZnO, $SiO_2$, $SiO_x$, $SiO_xN_y$, $Si_3N_4$, $Al_2O_3$, or $TiO_2$. If the channel layer 121 includes an insulating material, the channel layer 121 may space the second electrode layer 130 from the light emitting structure 110.

The channel layer 121 partially overlaps the light emitting structure 110 in a vertical direction.

The channel layer 121 increases the distance of the side between the second electrode layer 130 and the active layer 113. Accordingly, probability that electrical short occurs between the second electrode layer 130 and the active layer 113 can be reduced.

A partial top of the channel layer 121 may be exposed by the isolation etching. Accordingly, the channel layer 121 may contact a partial region of the light emitting structure 110 in a vertical direction and the remaining portion may not contact the light emitting structure 110 in a vertical direction.

The buffer layer 123 having a predetermined thickness is provided on an outer portion of the channel layer 121. The buffer layer 123 in the form of a band having a conical shape, polygonal shape, or convex lens shape may be provided at an outer peripheral portion of the light emitting structure 110 while being spaced apart from the light emitting structure 110. The buffer layer 123 may be inclined with respect to a vertical direction at a predetermined angle, but the embodiment is not limited thereto.

For example, the buffer layer 123 may be formed of a material selected from among Mo, Ni, Cu, Cr, Fe, Si, and Co, or the alloy of the combination thereof. The buffer layer 123 may include single metal or the alloy thereof. The buffer layer 123 may have a thermal expansion coefficient greater than that of the compound semiconductor and lower than that of the passivation layer 125. For example, the buffer layer 123 may include metal having a thermal expansion coefficient more approximate to the thermal expansion coefficient of GaN than that of the passivation layer 125. For example, the buffer layer 123 may be formed of a material selected from among Mo, Mo-based alloy, Ni, Ni-based alloy.

The passivation layer 125 may be disposed at the outer peripheral portion of the light emitting structure 110. The passivation layer 125 may be provided on the channel layer 121 to seal the buffer layer 123. The passivation layer 125 may surround an upper portion and a lateral side of the buffer layer 123. The passivation layer 125 may be provided along the outer peripheral portion of the light emitting structure 110 to protect the light emitting structure 110. The passivation layer 125 is formed over the buffer layer 123 such that the passivation layer 125 is higher than the light emitting structure 110. The passivation layer 125 may be formed between the buffer layer 123 and the light emitting structure 110, and a portion of the buffer layer 123 is exposed out of the passivation layer 125.

The passivation layer 125 may include a material selected from among $SiO_2$, $SiO_x$, $SiO_xN_y$, $Si_3N_4$, $Al_2O_3$, and $TiO_2$, but the embodiment is not limited thereto.

The second electrode layer 130 may be provided below the second conductive semiconductor layer 115 and the channel layer 121. The second electrode layer 130 may include at least one layer made of at least one material selected from the group consisting of Ag, Ni, Al, Rh, Pd, Ir, Ru, Mg, Zn, Pt, Au, Hf, and the combination thereof.

An ohmic layer (not shown) having a predetermined pattern may be provided between the second electrode layer 130 and the second conductive semiconductor layer 115. The ohmic layer may have a pattern in a matrix shape, a cross shape, a polygonal shape, or a circular shape. The ohmic layer may include a material selected from among ITO, IZO, IZTO, IAZO, IGZO, IGTO, AZO, and ATO. The light emitting structure 110 may be formed on the ohmic contact layer and the channel layer 121.

The conductive support member 140 may be provided below the second electrode layer 130. The conductive support member 140 may include a material selected from among Cu, Au, and a carrier wafer including a material such as Si, Ge, GaAs, ZnO, or SiC.

In the semiconductor light emitting device 100, the passivation layer 125 is formed at the outer peripheral portion of the light emitting structure 110, and the buffer layer 123 is provided inside the passivation layer 125. In the semiconductor light emitting device 100, the semiconductor layers 111, 113, and 115 of the light emitting structure 110 and the passivation layer 125 are stretched or shortened due to internal heat.

The passivation layer 125 may be bent outward from the outer peripheral portion of the light emitting structure 110 due to the difference in thermal expansion coefficient between the semiconductor layers 111, 113, and 115 and the passivation layer 125. The buffer layer 123 provided inside the passivation layer 125 can minimize the bending of the passivation layer 125. This is because the thermal expansion coefficient of the buffer layer 123 is approximate to that of a compound semiconductor material of the light emitting structure 110. For example, the thermal expansion coefficient of the buffer layer 123 may be about 4~6 μm/mk. Since the thermal expansion degree or the thermal expansion direction of the buffer layer 123 is similar to that of the light emitting structure 110, the total thermal expansion degree can be reduced as compared with a case in which only the passivation layer 125 is provided without the buffer layer 123.

FIGS. 2 to 10 are sectional views showing the manufacturing process of the semiconductor light emitting device 100 according to the first embodiment.

Figure 2:
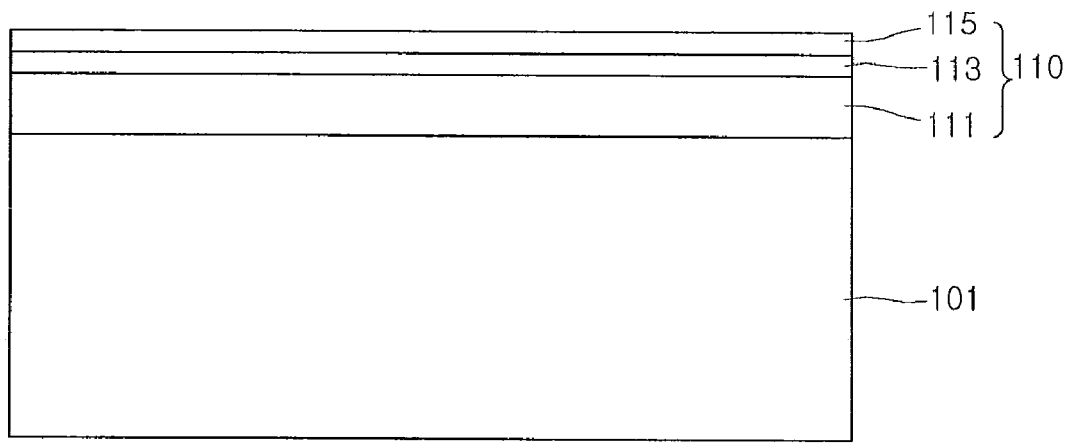
FIGS. 2 to 10 are sectional views showing the manufacturing process of a semiconductor light emitting device according to the first embodiment.

Referring to FIG. 2, the light emitting structure 110 is formed on a substrate 101. The light emitting structure 110 includes the first conductive semiconductor layer 111, the active layer 113, and the second conductive semiconductor layer 115.

The substrate 101 may include one selected from the group consisting of $Al_2O_3$, GaN, SiC, ZnO, Si, GaP, InP, and GaAs. A predetermined concave-convex pattern may be formed on the substrate 101. The substrate 101 may be provided thereon with another semiconductor layer such as a buffer layer and/or an undoped semiconductor layer, but the embodiment is not limited thereto.

The first conductive semiconductor layer 111 includes an N-type semiconductor layer. In this case, the second conductive semiconductor 115 includes a P-type semiconductor layer. In contrast, the first conductive semiconductor layer 111 includes a P-type semiconductor layer, and the second conductive semiconductor 115 includes an N-type semiconductor layer. An additional semiconductor layer such as a buffer layer and/or an undoped semiconductor layer may be formed between the substrate 101 and the first conductive semiconductor layer 111. Thereafter, the additional layer may be separated or removed from the structure.

Figure 3:
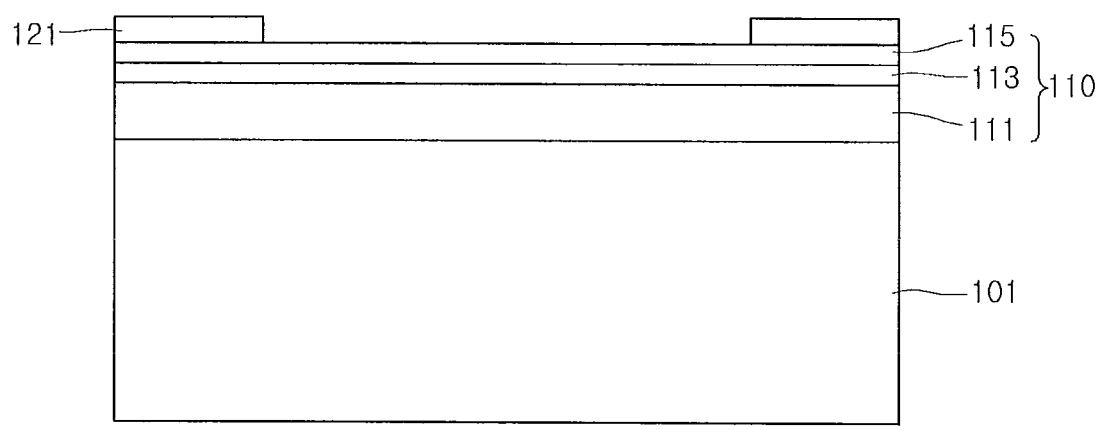

Referring to FIG. 3, the channel layer 121 is formed on an outer peripheral portion of the second conductive semiconductor layer 115. The channel layer 121 may include a material selected from among ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. The channel layer 121 may be provided in the form of a frame at an edge area of the second conductive semiconductor layer 115 in each chip. The channel layer 121 may include a conductive material having transmittance. In addition, the channel layer 121 may include a conductive material such as ITO, IZO, IZTO, IAZO, IGZO, IGTO, AZO, or ATO. The channel layer 121 may include an insulating material having transmittance. The channel layer 121 may include an insulating material such as $SiO_2$, $SiO_x$, $SiO_xN_y$, $Si_3N_4$, $Al_2O_3$, or $TiO_2$.

In other words, the channel layer 121 may be selectively formed on the light emitting structure 110, being corresponding to a unit chip region.

The channel layer 121 may be formed on a boundary of the unit chip region using a mask pattern. The channel layer 121 may be formed using various deposition methods such as a sputtering method.

Figure 4:
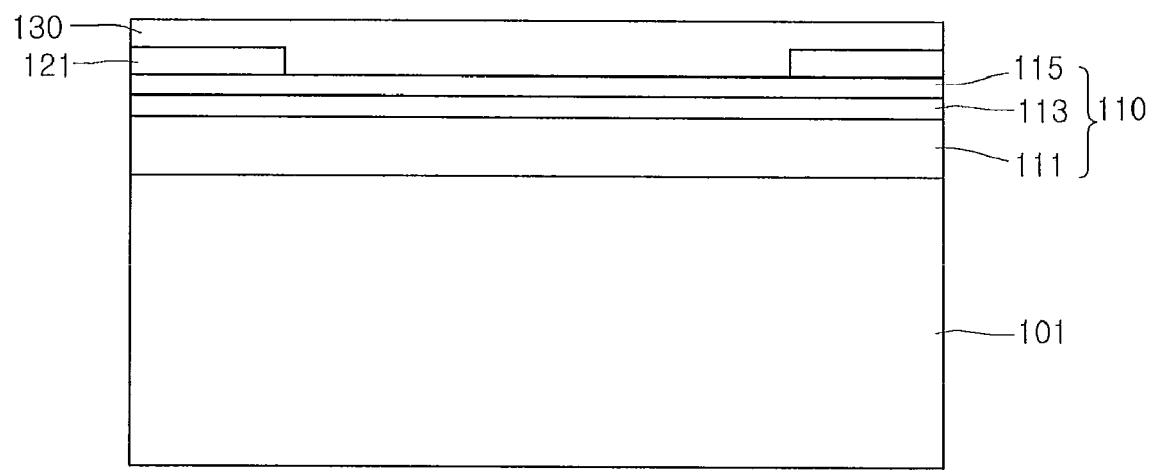
Figure 5:
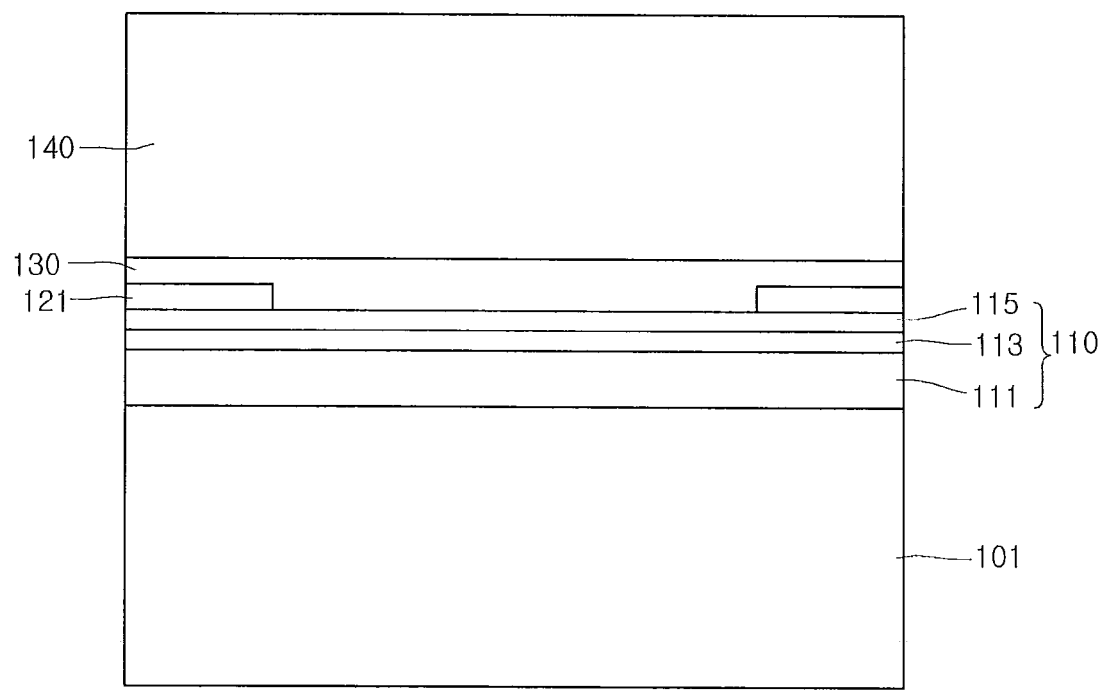

Referring to FIGS. 4 and 5, the second electrode layer 130 may be formed on both the channel layer 121 and the second conductive semiconductor layer 115. The conductive support member 140 may be formed on the second electrode layer 130.

The second electrode layer 130 and the conductive support member 140 may serve as a second electrode that is a conductive layer. An ohmic layer (not shown) having a predetermined pattern may be formed between the second conductive semiconductor layer 115 and the second electrode layer 130.

The second electrode layer 130 may have a structure including at least one layer made of a material selected from the group consisting of Ag, Ni, Al, Rh, Pd, Ir, Ru, Mg, Zn, Pt, Au, Hf, and the combination thereof. The conductive support member 140 may include a material such as Cu, Au, or a carrier wafer including a material such as Si, Ge, GaAs, ZnO, or SiC, and have a predetermined thickness.

Figure 6:
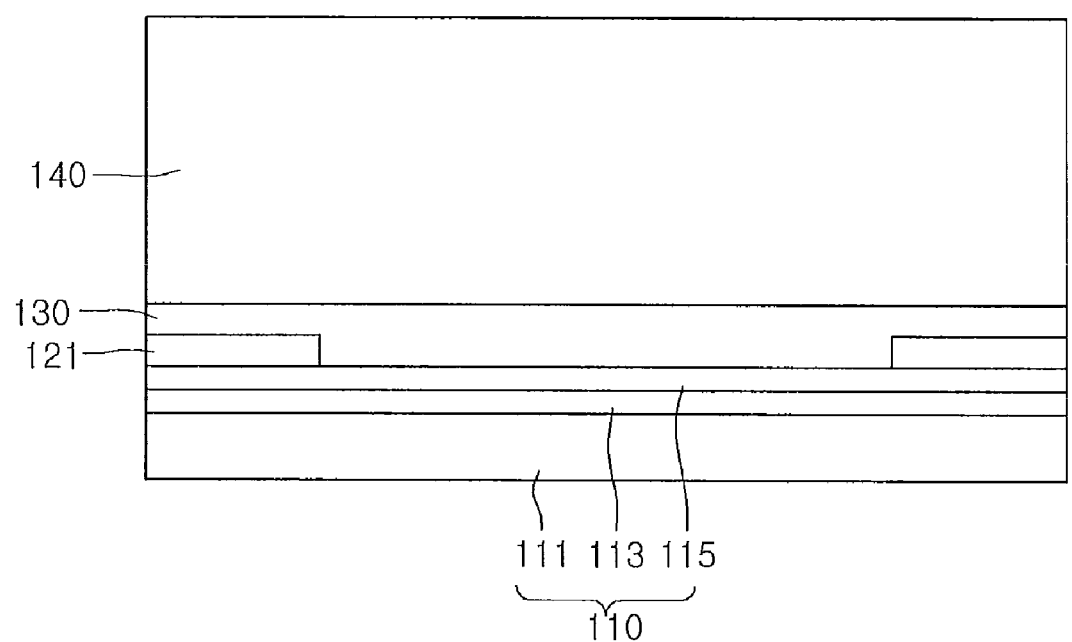

Referring to FIGS. 5 and 6, the substrate 101 is removed from the first conductive semiconductor layer 111. For example, the substrate 101 may be removed through a laser lift off (LLO) process. That is, a laser beam having a predetermined wavelength band is irradiated onto the substrate 101, so that thermal energy is concentrated at the boundary region between the substrate 101 and the first conductive semiconductor layer 111, thereby separating the substrate 101 from the first conductive semiconductor layer 111. The substrate 101 may be separated from the first conductive semiconductor layer 111 through another scheme. For example, when a different semiconductor layer such as a buffer layer is interposed between the substrate 101 and the first conductive semiconductor layer 111, wet etchant is injected into the buffer layer to remove the buffer layer, thereby separating the substrate 101 from the first conductive semiconductor layer 111.

Then, a bottom surface of the first conductive semiconductor layer 111 from which the substrate 101 has been removed may be polished through an inductively coupled plasma/reactive ion etching (ICP/RIE) scheme.

Figure 7:
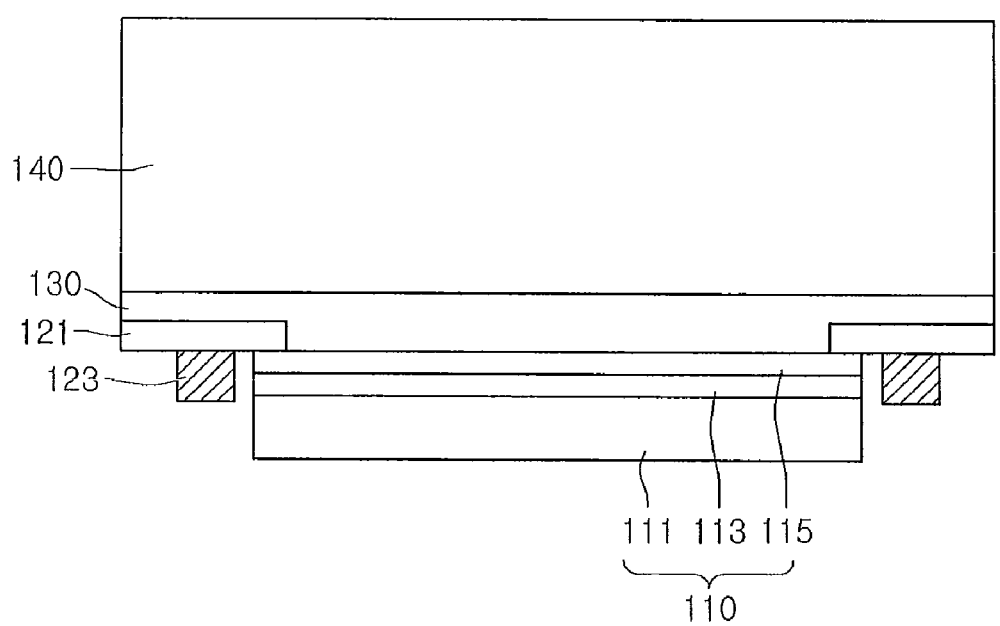
Figure 8:
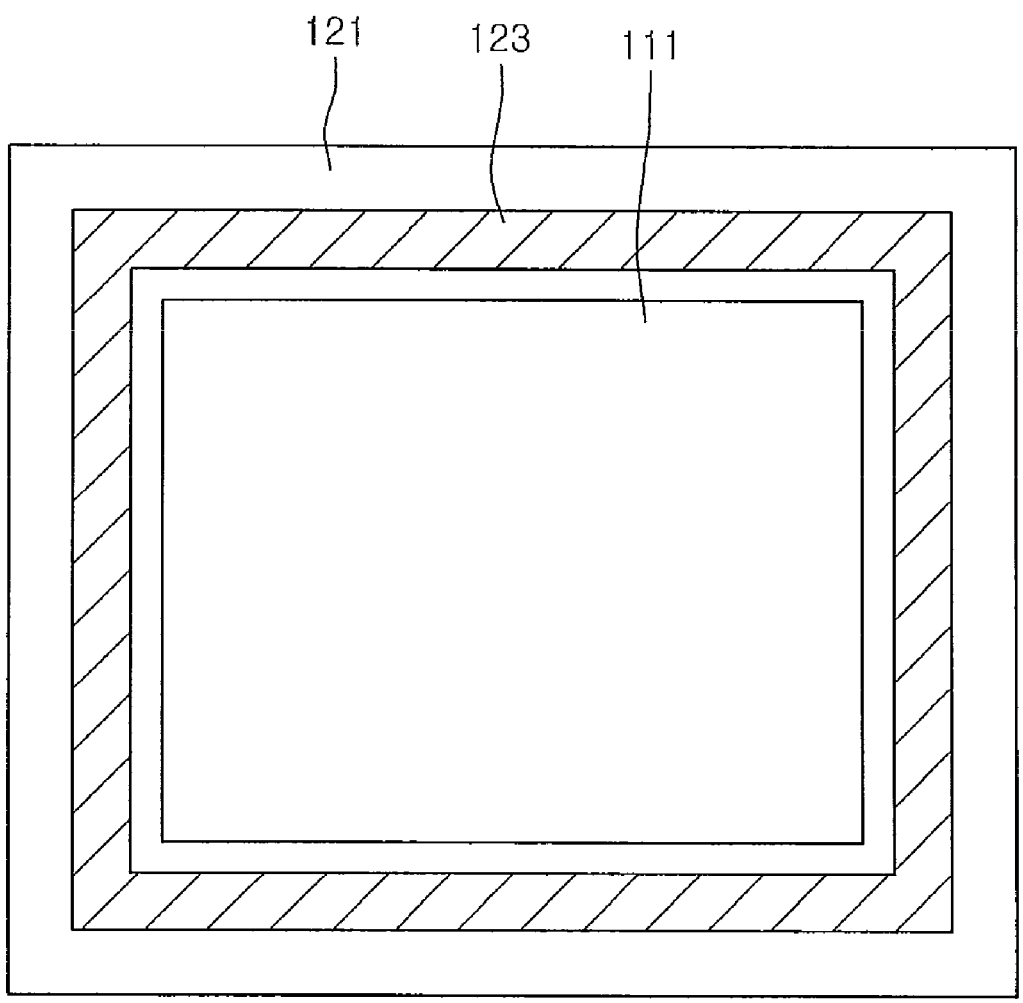

Referring to FIGS. 7 and 8, after the substrate 101 has been removed, the outer portion of a bottom surface of the channel layer 121 in the chip boundary region is exposed through a mesa etching scheme. The etching scheme may be performed through a dry and/or wet etch scheme.

When the channel layer 121 includes a conductive material, a light efficiency can be improved due to the ohmic characteristic of the channel layer 121. When the channel layer 121 includes an insulating material, the channel layer 121 can space the second electrode layer 130 apart from the second conductive semiconductor layer 115.

The buffer layer 123 may be formed at the outer portion of the bottom surface of the channel layer 121 along the outer peripheral portion of the light emitting structure 110. The buffer layer 123 may protrude in a stacking direction of the light emitting structure 110. The buffer layer 123 in the shape of a band may be formed at the outer peripheral portion of the light emitting structure 110 while being spaced apart from the light emitting structure 110.

The buffer layer 123 may have a conical shape, polygonal shape, or convex lens shape, but the embodiment is not limited thereto. The buffer layer 123 may be inclined with respect to a vertical direction with a predetermined angle. The inclination angle enables the orientation angle of side light to be changed.

For example, the buffer layer 123 may include one selected from among Mo, Ni, Cu, Cr, Fe, Si, and Co. In addition, the buffer layer 123 may include the alloy of a material selected from among Mo, Ni, Cu, Cr, Fe, Si, and Co. The buffer layer 123 may have a thermal expansion coefficient greater than that of the compound semiconductor and lower than that of the passivation layer (125 of FIG. 9). For example, the buffer layer 123 may include metal having a thermal expansion coefficient more approximate to the thermal expansion coefficient of GaN than that of the passivation layer 125. For example, the buffer layer 123 may include a material selected from among Mo, Mo-based alloy, Ni, Ni-based alloy.

Figure 9:
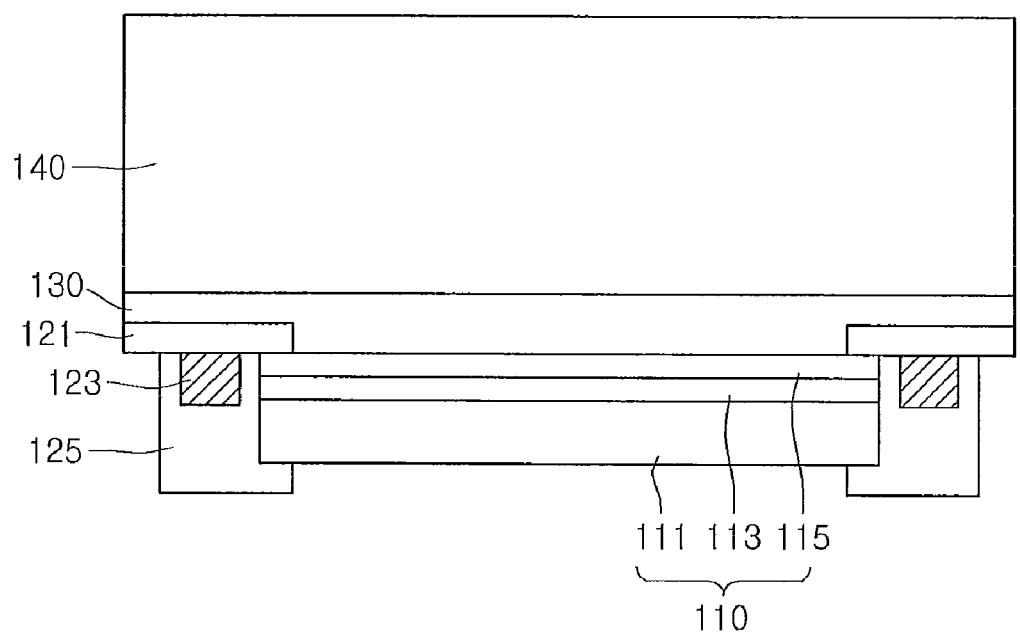

Referring to FIGS. 7 and 9, the passivation layer 125 is formed at the outer peripheral portion of the light emitting structure 110. The passivation layer 125 may be formed at the outer peripheral portion of the light emitting structure 110, the outer portion of the bottom surface of the channel layer 121, and an outer peripheral portion of the buffer layer 123. A portion of a lower end of the passivation layer 125 may extend to an outer top surface of the first conductive semiconductor layer 111.

The passivation layer 125 may include a material selected from among $SiO_2$, $SiO_x$, $SiO_xN_y$, $Si_3N_4$, $Al_2O_3$, and $TiO_2$.

The buffer layer 123 disposed in the passivation layer 125 minimizes the thermal expansion of the passivation layer 125, thereby preventing the passivation layer 125 from being bent from the outer peripheral portion of the light emitting structure 110.

When the channel layer 121 includes an insulating material, the buffer layer 123 partially makes contact with the channel layer 121, thereby minimizing the channel layer 121 from being bent due to thermal expansion.

Figure 10:
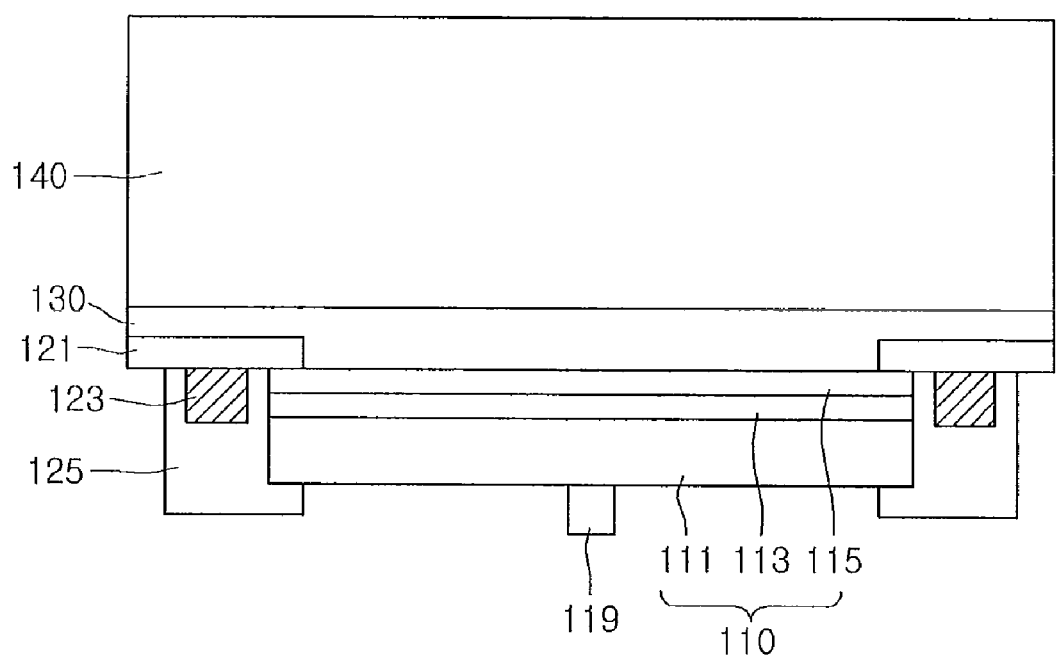

Referring to FIG. 10, the first electrode layer 119 having a predetermined pattern may be formed below the first conductive semiconductor layer 111. Concave-convex type roughness may be formed on a bottom surface of the first conductive semiconductor layer 111. Before or after the first electrode layer 119 is formed, the dicing process is performed to provide individual chips.

Chips are separated from each other by using laser scribing and braking equipment. In this case, the buffer layer 123 reduces stress of the passivation layer 125, thereby preventing delamination or breaking between the light emitting structure 110 and the second electrode layer 130 and preventing the chip from being bent.

Figure 11:
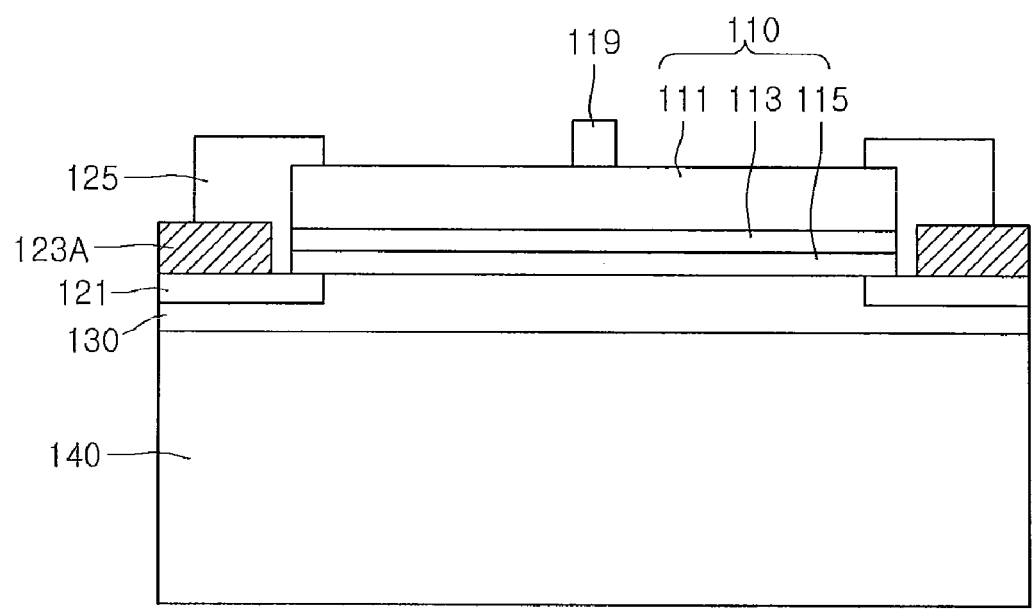
FIG. 11 is a sectional view showing a semiconductor light emitting device according to a second embodiment.

FIG. 11 is a sectional view showing a semiconductor light emitting device according to a second embodiment. In the following description, the same reference numerals will be assigned to elements the same as those of the first embodiment in order to avoid redundancy.

Referring to FIG. 11, in the semiconductor light emitting device according to the embodiment, the width of a buffer layer 123A is expanded at the outer peripheral portion of the light emitting structure 110. The buffer layer 123A is provided on an outer portion of the channel layer 121. The outer portion of the buffer layer 123A is exposed outward the passivation layer 125.

According to the embodiment, an outer end of the buffer layer 123A may be arranged in line with an outer end of the channel layer 121. The passivation layer 125 is formed between the buffer layer 123A and the light emitting structure 110, and the outer portion of the buffer layer 123A may be exposed from the passivation layer 125.

According to the embodiments, the structure of the channel layer 121, the buffer layer 123 or 123A, and the passivation layer 125 provided between the light emitting structure 110 and the second electrode layer 130 or the sequence of forming the channel layer 121, the buffer layer 123 or 123A, and the passivation layer 125 can be partially changed. For example, after forming the passivation layer 125 on an outer wall of the light emitting structure 110, a recess may be formed through an etching process, and then the buffer layer 123 or 123A may be formed in the recess. In addition, after forming a recess in the channel layer 121, the buffer layer 123 or 123A may be inserted into the recess. Such a modification of the embodiments can be achieved by changing the sequence of the etching process and the forming process, but the embodiments are not limited thereto.

The semiconductor light emitting device according to the embodiments can be applied to various devices, such as a light emitting device package, a backlight unit, and an illumination device.

The light emitting device package may include a body, a first lead electrode, a second lead electrode, a semiconductor light emitting device according to the embodiments, and a molding member.

The first lead electrode and the second lead electrode may be disposed at the body. The semiconductor light-emitting device may be electrically connected to the first lead electrode and the second lead electrode. The molding member may be configured to mold the semiconductor light emitting device.

The body may be formed to include, for example, silicon material, synthetic resin, or metallic material, and an inclined surface may be formed around the semiconductor light emitting device. The first lead electrode and the second lead electrode may be electrically disconnected from each other, and may provide power to the semiconductor light emitting device. Also, the first lead electrode and the second lead electrode may reflect light emitted from the semiconductor light emitting device, thus increasing light efficiency. Also, the first lead electrode and the second lead electrode may serve to discharge heat generated by the semiconductor light emitting device.

The semiconductor light emitting device may be disposed on the body, or may be disposed on the first lead electrode or the second lead electrode. The semiconductor light emitting device may be electrically connected by, for example, a wire to the first lead electrode, and may be connected to the second lead electrode in, for example, a die-bonding configuration.

The molding member may mold the semiconductor light emitting device to protect the semiconductor light emitting device. Also, a fluorescent material may be included in the molding member to change a wavelength of light emitted from the semiconductor light emitting device.

The semiconductor light emitting device according to embodiments may be packaged in, for example, a semiconductor substrate, an insulating substrate, or a ceramic substrate (such as resin material or silicon).

The semiconductor light emitting device according to the embodiments can be applied to a backlight unit.

The backlight unit can be adapted to a display apparatus such as a liquid crystal display to supply light to the display apparatus. The backlight unit may include a light supply part, a light guide plate, and an optical sheet. The light emitting device package according to the embodiment can be adapted to the light supply part. The backlight unit may not employ the light guide plate.

The semiconductor light emitting device according to the embodiments can be applied to an illumination device.

The illumination device may include a case and a light supply module. The light supply module may be disposed in the case. The light emitting device package according to the embodiments can be adapted to the light supply module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
 a light emitting structure including a plurality of compound semiconductor layers;
 a second electrode layer formed under the light emitting structure;
 an isolation layer provided under the light emitting structure and at an outer portion of the second electrode layer;
 a metallic layer provided on the isolation layer while being spaced apart from an outer portion of the light emitting structure; and
 an insulating layer formed at outer portions of the metallic layer and the light emitting structure,
 wherein the isolation layer extends from the bottom surface of the light emitting structure to a bottom surface of the metallic layer, and
 wherein the insulating layer is provided on the isolation layer and between the metallic layer and the light emitting structure.

2. The semiconductor light emitting device of claim 1, wherein the isolation layer comprises at least one selected from the group consisting of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$.

3. The semiconductor light emitting device of claim 1, wherein the metallic layer comprises one metal selected from the group consisting of Mo, Ni, Cu, Cr, Fe, and Co, or alloy of at least two above metals.

4. The semiconductor light emitting device of claim 1, wherein the insulating layer comprises at least one selected from the group consisting of $SiO_2$, $SiO_x$, $SiO_xN_y$, $Si_3N_4$, $Al_2O_3$, and $TiO_2$.

5. The semiconductor light emitting device of claim 1, further comprising a conductive support member provided under the second electrode layer and the isolation layer.

6. The semiconductor light emitting device of claim 1, wherein the light emitting structure comprises group III-V compound semiconductors, and wherein the light emitting structure comprises a first conductive semiconductor layer connected to a first electrode, an active layer under the first conductive semiconductor layer, and a second conductive semiconductor layer provided between the active layer and the second electrode layer and provided between the active layer and the isolation layer.

* * * * *